(12) United States Patent
Miyoshi et al.

(10) Patent No.: US 10,429,011 B2
(45) Date of Patent: Oct. 1, 2019

(54) METHOD OF MANUFACTURING LIGHT EMITTING DEVICE

(71) Applicant: NICHIA CORPORATION, Anan-shi, Tokushima (JP)

(72) Inventors: Tomonori Miyoshi, Tokushima (JP); Kenji Ozeki, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/914,190

(22) Filed: Mar. 7, 2018

(65) Prior Publication Data

US 2018/0195675 A1 Jul. 12, 2018

Related U.S. Application Data

(63) Continuation of application No. 14/293,010, filed on Jun. 2, 2014, now abandoned.

(30) Foreign Application Priority Data

Jun. 5, 2013 (JP) .................................. 2013-118558

(51) Int. Cl.
*F21K 9/68* (2016.01)
*H01L 25/075* (2006.01)
(Continued)

(52) U.S. Cl.
CPC .............. *F21K 9/68* (2016.08); *F21Y 2115/10* (2016.08); *H01L 25/0753* (2013.01);
(Continued)

(58) Field of Classification Search
CPC .......... G02B 6/0065; H01L 2924/0002; H01L 33/56; H01L 33/60; H01L 25/0753; H01L 2933/0058
See application file for complete search history.

(56) References Cited

U.S. PATENT DOCUMENTS

| 4,254,453 A | 3/1981 | Mouyard et al. |
| 5,779,351 A | 7/1998 | Erickson et al. |

(Continued)

FOREIGN PATENT DOCUMENTS

| CN | 101878540 A | 11/2010 |
| CN | 102109136 A | 6/2011 |

(Continued)

OTHER PUBLICATIONS

Extended European Search Report of the corresponding European Application No. 14170745.5, dated Oct. 6, 2014.

*Primary Examiner* — Alexander K Garlen
*Assistant Examiner* — Eric T Eide
(74) *Attorney, Agent, or Firm* — Global IP Counselors, LLP

(57) ABSTRACT

A method of manufacturing a light emitting device includes: mounting a plurality of light emitting elements on a base material; joining a plurality of translucent members respectively on upper surfaces of the light emitting elements; covering side surfaces of the light emitting elements and side surfaces of the translucent members with a light reflecting member at once; and forming a groove in the light reflecting member between adjacent ones of the light emitting elements.

16 Claims, 6 Drawing Sheets

(51) Int. Cl.
*H01L 33/60* (2010.01)
*F21Y 115/10* (2016.01)
*H01L 33/56* (2010.01)
*H01L 33/58* (2010.01)

(52) U.S. Cl.
CPC .............. *H01L 33/56* (2013.01); *H01L 33/58* (2013.01); *H01L 33/60* (2013.01); *H01L 2224/16* (2013.01); *H01L 2924/0002* (2013.01); *H01L 2933/0058* (2013.01)

(56) References Cited

U.S. PATENT DOCUMENTS

| | | | |
|---|---|---|---|
| 5,836,676 | A | 11/1998 | Ando et al. |
| 8,735,914 | B2 * | 5/2014 | Agatani .............. H01L 25/0753 |
| | | | 257/88 |
| 2009/0262532 | A1 | 10/2009 | Wilcox et al. |
| 2010/0295071 | A1 | 11/2010 | Tsai et al. |
| 2010/0320479 | A1 | 12/2010 | Minato et al. |
| 2011/0121732 | A1 | 5/2011 | Tsutsumi |
| 2011/0186867 | A1 | 8/2011 | Singer et al. |
| 2012/0091489 | A1 | 4/2012 | Aoki et al. |
| 2012/0104452 | A1 | 5/2012 | Miyoshi et al. |
| 2012/0211774 | A1 | 8/2012 | Harada |
| 2012/0235169 | A1 | 9/2012 | Seko et al. |
| 2012/0305969 | A1 | 12/2012 | Sato et al. |
| 2013/0027616 | A1 * | 1/2013 | Takata .............. G02F 1/133514 |
| | | | 348/725 |
| 2013/0256711 | A1 * | 10/2013 | Joo ....................... H01L 33/486 |
| | | | 257/88 |
| 2013/0329440 | A1 | 12/2013 | Tsutsumi et al. |
| 2014/0098529 | A1 * | 4/2014 | Hata ................... H01L 25/0753 |
| | | | 362/231 |
| 2014/0239320 | A1 | 8/2014 | Miyoshi et al. |
| 2014/0340890 | A1 * | 11/2014 | Hata ...................... A01G 7/045 |
| | | | 362/231 |
| 2015/0001566 | A1 * | 1/2015 | Barchmann .............. H05K 1/02 |
| | | | 257/98 |
| 2015/0287896 | A1 | 10/2015 | Minato et al. |

FOREIGN PATENT DOCUMENTS

| | | |
|---|---|---|
| EP | 2325883 A2 | 5/2011 |
| JP | 63-024857 U1 | 2/1988 |
| JP | 2004-266235 A | 9/2004 |
| JP | 2009-218274 A | 9/2009 |
| JP | 2010-157638 A | 7/2010 |
| JP | 2010-192629 A | 9/2010 |
| JP | 2010-283244 A | 12/2010 |
| JP | 2012-059939 A | 3/2012 |
| JP | 2012-099545 A | 5/2012 |
| JP | 2012-169189 A | 9/2012 |
| JP | 2013-197439 A | 9/2013 |
| WO | 2014081042 A1 | 5/2014 |

* cited by examiner

METHOD OF MANUFACTURING LIGHT EMITTING DEVICE

CROSS-REFERENCE TO RELATED APPLICATIONS

This application is a continuation application of U.S. patent application Ser. No. 14/293,010, filed on Jun. 2, 2014. This application claims priority to Japanese Patent Application No. 2013-118558 filed on Jun. 5, 2013. The entire disclosures of U.S. patent application Ser. No. 14/293,010 and Japanese Patent Application No. 2013-118558 are hereby incorporated herein by reference.

BACKGROUND

Technical Field

The present invention relates to a method of manufacturing a light emitting device including a plurality of light emitting elements.

Related Art

Semiconductor light emitting elements have been used in recent years not only as illumination light sources instead of fluorescent bulbs, but also as light sources with good directionality and high brightness in projection illumination devices, projectors, and so forth, such as automotive headlights.

The light emitting device used in such applications is proposed, for example, in JP2012-99545A, and has the side faces of a plurality of light emitting elements covered with a reflecting material, with these elements being arranged in a row and close together.

SUMMARY

A method of manufacturing a light emitting device according to one embodiment includes: mounting a plurality of light emitting elements on a base material; joining a plurality of translucent members respectively on upper surfaces of the light emitting elements; covering side surfaces of the light emitting elements and side surfaces of the translucent members with a light reflecting member at once; and forming a groove in the light emitting device to cut the light reflecting member between adjacent ones of the light emitting elements.

A method of manufacturing a light emitting device according to another embodiment includes: mounting a plurality of light emitting elements on a base material; joining a single translucent member on upper surfaces of the light emitting elements; cutting the translucent member between adjacent ones of the light emitting elements; covering side surfaces of the light emitting, elements and side surfaces of divided portions of the translucent member with a light reflecting member; and forming a groove in the light emitting device to cut the light reflecting member between adjacent ones of the light emitting elements.

A method of manufacturing a light emitting device includes: mounting a plurality of light emitting elements on a base material; covering side surfaces of the light emitting elements with a light reflecting member; forming a groove in the light emitting device to cut the light reflecting member between adjacent ones of the light emitting elements; and filling the groove with a light blocking member.

DETAILED DESCRIPTION OF EXEMPLARY EMBODIMENTS

Figure 1A:
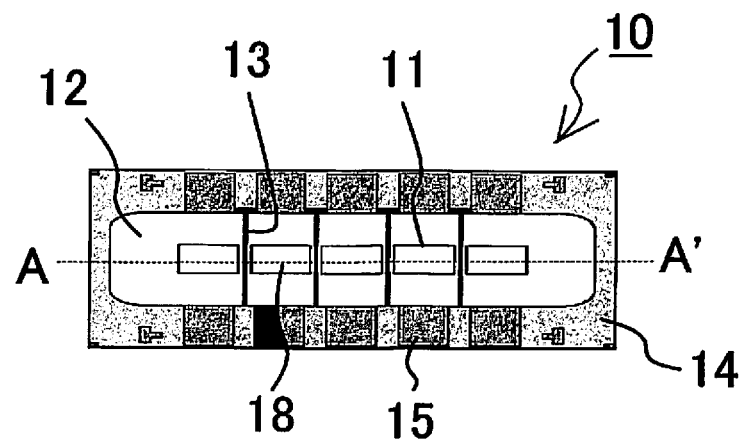
FIG. 1A is a simplified plan view of the light emitting device in Embodiment 1 of the present invention.

The present invention is an object thereof to provide a light emitting device having good brightness distribution and good visibility, and with which there is a clear difference between emitting and non-emitting parts.

The sizes and the arrangement relationships of the members in each of drawings are occasionally shown exaggerated for ease of explanation. Further, in the description below, the same designations or the same reference numerals may, in principle, denote the same or like members and duplicative descriptions will be appropriately omitted. In addition, constitutions described in some of examples and embodiments can be employed in other examples and embodiments.

In the specification, the term "upper" and "lower" also mean a light extraction side and the opposite side from the light extraction side, respectively. For example, the upper face means the light extraction face of the light emitting device, whereas the lower face means the opposite side from light extraction face of the light emitting device.

Figure 1B:
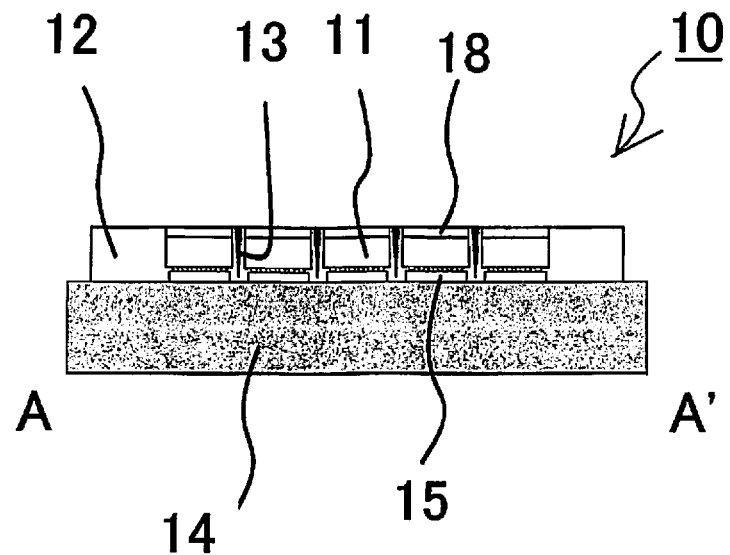
FIG. 1B is a cross section along the A-A' line in FIG. 1A.

As shown in FIGS. 1A and 1B, the light emitting device 10 in this embodiment has a plurality of light emitting elements 11, at least one light reflecting member 12 and at least one light blocking member 13.

According to the light emitting devices, and particularly with light emitting devices equipped with a plurality of light emitting elements, it is possible to provide a light emitting device with good visibility, with which there is a clear difference between elements in an emission state and elements in a non-emission state.

Light Emitting Elements 11

A light emitting diode is usually used as the light emitting element 11.

The composition, emission color or wavelength, size, number, etc., can be suitably selected according to the intended use. Examples of light emitting element emitted with blue or green light include one using a semiconductor layer such as ZnSe, gallium a nitride-based semiconductor, for example, $In_xAl_yGa_{1-x-y}N$ ($0 \leq X$, $0 \leq Y$, $X+Y<1$), GaP and the like, examples of light emitting element emitted with red light include one using a semiconductor layer such as GaAlAs, AlInGaP and the like.

The light emitting elements are usually formed by laminating semiconductor layers on a growth substrate (such as a sapphire substrate). The growth substrate may have concavity and convexity on the face joined with the semiconductor layer. This allows the critical angle when light emitted from the semiconductor layer irradiates the growth substrate to be changed intentionally, and allows the light to be easily extracted to the outside of the growth substrate.

The growth substrate of the light emitting elements may be removed after the lamination of the semiconductor layers. This removal can be accomplished, for example, by polishing, LLO (laser lift-off), etc. When the growth substrate is to be removed, the semiconductor layer may also include a supporting substrate used for mounting.

The light emitting elements preferably have a pair of positive and negative electrodes on the same side to the semiconductor layers. This allows the light emitting elements to be flip-chip mounted on a base material for mounting. In this case, the face opposite the face on which the pair of electrodes is formed will be the light extraction face. In flip-chip mounting, the light emitting elements are electrically connected to a wiring pattern on the base material by using a bump joining member, a thin-film joining member, or a paste joining member having conductivity, such as solder.

Alternatively, in the case of face-up mounting, the face on which the pair of electrodes is formed may be the light extraction face.

The light emitting elements preferably have a pair of positive and negative electrodes on the same side, but may instead have a pair of positive and negative electrodes on different sides. In the case of light emitting elements having an opposing electrode structure in which the positive and negative electrodes are provided on opposite faces, the lower face electrode may be fixed to the base material with a conductive material, and the upper face electrode may be connected to the base material with a conductive wire or the like.

A plurality of the light emitting elements are included in a single light emitting device. The plurality of light emitting elements are arrayed in a row, for example, but may instead be arrayed in a matrix. The number of light emitting elements can be suitably set according to the characteristics, size, and so forth of the light emitting device to be obtained.

The arranged light emitting elements are preferably close to each other, and when automotive applications, as well as brightness distribution and so forth are taken into account, the distance between the light emitting elements is preferably less than the size of the light emitting elements themselves (such as the length along one side), and more preferably, for example, is about 30% or less, and even more preferably 20% or less, of the size of the light emitting elements themselves. Thus disposing the light emitting elements close together affords a light emitting device with a planar light source that offers little emission variation and high emission quality.

Light Reflecting Members 12

The light emitting device has one or more light reflecting member 12. That is, the light reflecting member may be formed to cover a plurality of light emitting elements integrally. Alternatively, the light reflecting members may be formed to cover each light emitting elements individually, or to cover a plurality of assorted light emitting elements.

As shown in FIGS. 1A and 1B, the light reflecting members 12 cover the side faces of the light emitting elements 11. The "side faces of the light emitting elements 11" here refers to at least part of the side faces of the semiconductor layer in the thickness direction, and preferably all of the semiconductor layer in the thickness direction and/or part of the side faces of the semiconductor layer around the outer periphery, and more preferably the entire side faces around the outer periphery of the semiconductor layer. The term "cover" as used herein may mean that a separate layer is interposed between semiconductor layer and the light reflecting member, but the light reflecting member is preferably in contact with the semiconductor layer. It is especially preferable for the entire outer peripheral side faces of the light emitting elements that are included to be covered by the light reflecting members. Consequently, the light emitted from the light emitting elements at the boundary between the light emitting elements and the light reflecting members will be reflected within the light emitting elements, so the light will not be absorbed by adjacent light emitting elements, and will instead be emitted from the upper faces of the light emitting elements to the upper faces of the translucent members and the outside.

The separate layer referred to here is, for example, an adhesive agent or an embedding material. An adhesive agent is used when the light emitting elements are further provided with translucent members that cover upper face of the light emitting element. In particular, when translucent members that are larger than the light emitting elements are provided, the adhesive agent will sometimes be disposed all the way to the light emitting element side faces so that light from the light emitting elements will propagate more easily to the translucent members. If an adhesive agent is interposed between the semiconductor layer and the light reflecting members, the adhesive agent is preferably disposed so as not to bulge out from directly below the translucent members. Also, when an embedding material is interposed, it is preferably a light reflecting resin. When the embedding material is a light reflecting resin, there are no particular restricts on the interposition thickness, but when the above-mentioned covering of the side faces of the light emitting elements 11 by the light reflecting members 12 is taken into account, it is preferable for the material to be interposed only in part of the thickness direction of the side faces of the semiconductor layer, exposing at least the side higher than the light emitting layer of the light emitting elements, or for the material to be interposed so as to expose the light emitting layer and the side higher than the light emitting layer.

When a separate layer is interposed between the light emitting elements and the light reflecting resin, the separate layer is preferably disposed so as not to be exposed on the light emitting face side of the light emitting device. If the separate layer is exposed on the light emitting face side, there is the risk that light will be reflected and propagate between the light emitting elements and the light reflecting members, resulting in uneven color.

The upper faces of light reflecting members disposed between the light emitting elements can be in the same plane, or substantially in the same plane, as the upper faces of the light emitting elements (the light extraction face). The term "in the same plane" here means that a height difference of about ±10%, and preferably ±5%, of the thickness of the light reflecting members is allowed (the same applies elsewhere in this Specification).

Alternatively, as discussed below, if at least one translucent member that covers the upper faces of the light, emitting elements are further provided to these faces, the upper faces of the light reflecting members preferably is on the same plane, or substantially on the same plane, as the upper face of the translucent member.

In particular, as discussed below, the thickness (width) of the light reflecting members covering the side faces of the light emitting elements to the light blocking member at the locations where the light blocking are disposed between the light reflecting members in between the light emitting elements is preferably about 10 to 100 μm, and more preferably about 50 to 100 μm. Setting to this thickness will keep light leakage to a minimum, and allow the light to be reflected efficiently, while reducing the distance between adjacent light emitting elements and ensuring a good brightness distribution.

The light reflecting members are formed from a material capable of reflecting the light emitted from the light emitting elements. Consequently, the light emitted from the light emitting elements is reflected within the light emitting elements at the boundary between the light emitting elements and the light reflecting members. As a result, the light propagates within the light emitting elements, and is ultimately emitted from the upper faces of the light emitting elements to the upper faces of the translucent members and to the outside.

The light reflecting members can be formed from a resin including at least one of a silicone resin, a modified silicone resin, an epoxy resin, a modified epoxy resin, an acrylic resin or a hybrid resin containing one or more of those resins, and a reflecting substance. Examples of the reflecting substance include titanium oxide, silicon oxide, zirconium oxide, potassium titanate, alumina, aluminum nitride, boron nitride, mullite and the like.

The content of the reflecting substance, etc., can change the amount of light reflected, transmitted, etc., by the light reflecting members, so it can be suitably adjusted according to the desired characteristics of the light emitting device and so forth. For example, the reflecting substance is preferably contained in an amount of at least 30 wt %.

As the light reflecting members, a material having heat dissipation property in addition to light reflecting property may be used. The thermal conductivity of the light reflecting member is preferably at least about 0.2 w/m·k, and more preferably at least 1 W/m·K. Setting the thermal conductivity higher, it is possible to improve the heat dissipation property. Examples of such material include aluminum nitride, boron nitride and the like having relatively high thermal conductivity.

For example, as discussed below, if the translucent members contain a fluorescent material, the fluorescent material will sometimes undergo self-heating attributable to Stokes loss, and this heat may lower the light conversion efficiency. On the other hand, if the light reflecting members have high thermal conductivity, heat from the fluorescent material in the translucent members can be efficiently dissipated.

The light reflecting members can be formed, for example, by injection molding, potting, resin printing, transfer molding, compression molding, and so forth.

A Zener diode or other such protective element may be installed in the light emitting device of the present invention. Embedding a protective element in the light reflecting members, for example, will prevent a decrease in light extraction caused when the light from the light emitting elements is absorbed by the protective element, or is blocked by the protective element.

Light Blocking Members 13

The light emitting device has one or more light blocking member 13. That is, one or more the light blocking member may be disposed in between light emitting elements and disposed separated from the light emitting elements.

For example, as shown in FIGS. 1A and 1B, one or more the light blocking member 13 may be disposed between the light reflecting members 12 covering the side faces between the light emitting elements 11. The phrase "between the light reflecting members" here means that the light reflecting members covering the side faces of the light emitting elements are segmentalized. That is, the light blocking member is preferably disposed in a groove which is formed in the light reflecting member at between the light emitting elements 11. Therefore, the light blocking members 13 may only be disposed between at least the adjacent light emitting elements as seen in top view, and disposed separated from the light emitting elements, but are preferably disposed extending from between the adjacent light emitting elements toward the ends of the light reflecting members, and more preferably disposed extending to the ends of the light reflecting members. This disposition effectively prevents the light emitted from one light emitting element from passing through the light reflecting members and interfering with adjacent light emitting elements and/or the light emitted from those, etc.

The light blocking members 13 are preferably disposed in a straight line between the light emitting elements, as seen in top view, and more preferably are disposed in a straight line in the middle between the light emitting elements. This disposition ensures uniformity in the thickness of the light reflecting members covering the area between light emitting elements, and affords a light emitting device with good visibility and a good brightness distribution.

The width of the light blocking members in cross sectional view may be substantially uniform, but may also taper down as in a V shape, for example. A V-shaped cross section allows light in the side face direction to be confined in the downward direction, which affords better visibility. A V-shaped cross section can be formed by using a blade with a tapered tip, etc., in the segmentalization of the light reflecting members.

The width is preferably set so that the material forming the light blocking members fills in the space by capillary action in the manufacturing method discussed below. The width may be about 10 to 100 μm, preferably 30 to 90 μm, and more preferably 40 to 70 μm, in plan view, for example. Thus setting the width effectively prevents light leakage between adjacent light emitting elements, and ensures good visibility and good brightness distribution. In particular, this minimizes the interference of light from a lit light emitting element with an unlit light emitting element when adjacent light emitting elements are in lit and unlit states, and this greatly reduces the micro-emission level of unlit light emitting elements.

The height of the light blocking members is preferably at least equal to the height corresponding to all or part of the thickness direction of the semiconductor layer of the light emitting elements, and the upper face of the light blocking members more preferably is on the same plane, or substantially in the same plane, as the upper faces of the light reflecting members and/or the light extraction faces of the light emitting elements.

Alternatively, as discussed below, if the translucent members that cover the light extraction faces of the light emitting elements are further provided to these faces, the upper faces of the light blocking members preferably are on the same plane, or substantially on the same plane, as the upper faces of the translucent members. In other words, the light blocking members preferably cover the side faces of the translucent members.

Also, as discussed below, if the light emitting elements are joined on the base material, the lower ends of the light blocking members preferably coincide with the surface of the base material, but may not necessarily have to reach all the way to the surface of the base material. This would be to avoid damaging the base material and/or the wiring, etc., disposed on the base material surface during processing. If the lower ends of the light blocking members do not reach the base material surface, then the lower ends of the light blocking members preferably are disposed below the lower faces of the light emitting elements. This minimizes light interference between adjacent light emitting elements.

Furthermore, when the light emitting elements are joined on the base material, and an embedding material is embedded between the base material and the light emitting elements (discussed below) and reaches to between the light emitting elements, the lower ends of the light blocking members may be disposed either on the surface of the embedding material or in the embedding material.

The light blocking members can be formed from a material capable of blocking or absorbing the light emitted from the light emitting elements. As mentioned above, this effectively prevents light leakage between adjacent light emitting elements, and ensures good visibility and good brightness distribution. In particular, this minimizes the interference of light from a lit light emitting element with an unlit light emitting element when adjacent light emitting elements are in lit and unlit states, and this greatly reduces the microemission level of unlit light emitting elements.

The light blocking members may be disposed between some or all of the light emitting elements installed in the light emitting device. For example, when a plurality of light emitting elements are arranged in a row, a light blocking member may be disposed at only one location between any two adjacent light emitting elements, and when the light emitting elements are arranged in two rows, the light blocking members may be disposed between the rows, and when the light emitting elements are disposed in a matrix, the light blocking members may be disposed in a lattice shape between all of the light emitting elements. The layout of the light blocking members can be suitably varied according to the object and application.

The light blocking members can be formed from a resin including at least one of a silicone resin, a modified silicone resin, an epoxy resin, a modified epoxy resin, an acrylic resin or a hybrid resin containing one or more of those resins, and a light absorbing substance. Examples of the light absorbing substance include a black pigment, carbon black and the like.

Further, the light reflecting members may be formed using a reflecting substance together with the light absorbing substance. Examples of the reflecting substance include titanium oxide, silicon oxide, zirconium oxide, potassium titanate, alumina, aluminum nitride, boron nitride, mullite and the like.

The content of light absorbing substance, reflecting substance, etc., can be suitably adjusted as dictated by the type and so forth of the light absorbing substance and reflecting substance being used. For example, it is preferably that the content of the light absorbing substance is at least 1 wt % and the reflecting substance is at least 30 wt %.

The light blocking members may be made from a material that has the above-mentioned heat dissipation properties, in addition to having light absorption properties and light reflecting properties.

The light blocking members can be formed by removing the light reflecting members where the light blocking members are to be disposed by using a blade, laser irradiation, or the like after the formation of the light reflecting members, and using a mold method or the like to fill in these removed locations.

Translucent Members

The light emitting device preferably further has translucent members that cover the upper faces (light extraction faces) of the light emitting elements (see 18 in FIG. 1B). The translucent members are able to transmit light emitted from the light emitting elements, and release this light to the outside.

The translucent members preferably cover the entire upper faces of the light emitting elements in order to extract all of the light emitted from the light emitting elements. However, it may be that the more the size of the translucent members exceeds that of the light emitting elements, the lower is the brightness of the light emitted from these elements. Therefore, the translucent members covering the light emitting elements are at least as large as the light emitting elements, but are preferably as close in size to that of the light emitting elements as possible. This affords even higher brightness, in addition to making to possible for the light emitting device to be even more compact.

When a plurality of light emitting elements are individually covered by translucent members that are larger than the light emitting elements, the distance between the translucent members is preferably less than the size of the translucent members themselves (the length along one side, for example), and is more preferably no more than 20% of the size of the translucent members themselves. Thus disposing the translucent members close together gives a light emitting device of a planar light source with little emission unevenness and high emission quality.

The translucent member may individually cover a plurality of light emitting elements, or may integrally cover a plurality of light emitting elements.

The side faces of translucent members that individually cover a plurality of light emitting elements are preferably covered by the light reflecting members. In this case, the light blocking members are preferably disposed between the light reflecting members in between the plurality of translucent members.

The side faces of the translucent members integrally covering a plurality of light emitting elements does not necessarily have to be covered by the light reflecting members and/or the translucent members.

It is especially preferable if the side faces of translucent members that individually cover a plurality of light emitting elements are covered by the light reflecting members, and the light blocking members are disposed between the light reflecting members in between the translucent members.

For example, (1) after a plurality of light emitting elements have been joined on the base material, a plurality of translucent members may be disposed on the various upper faces of these light emitting elements, after which this may be covered with the light reflecting members, and the light blocking members are formed between the light reflecting members, or (2) after a plurality of light emitting elements have been joined on the base material, a single translucent member may be disposed on the upper faces of these light emitting elements, after which the translucent member is cut between the light emitting elements with a blade, laser irradiation, or the like, this is covered with the light reflecting members, and light blocking members are formed between the light reflecting members, or (3) after a plurality of light emitting elements have been joined on the base material, the light reflecting members may cover the side faces of the light emitting elements, and a single translucent member may be disposed on the light extraction faces of a plurality of light emitting elements, after which the translucent member and the light reflecting members are cut between the light emitting elements with a blade, laser irradiation, or the like, and the light blocking members are formed, or (4) after a plurality of light emitting elements have been joined on the base material, the light reflecting members may cover the side faces of the light emitting elements, and light blocking members may be formed, after which a single translucent member is formed on the light extraction faces of the light emitting elements.

When the side faces of the translucent members are covered by the light reflecting members and/or the light blocking members, the upper faces of the translucent members preferably are on the same plane, or substantially on the same plane, as the upper faces of the light reflecting members and/or the light blocking members. It is particularly preferable for the upper faces of the translucent members to lie on the same plane as the upper faces of the light reflecting members and the light blocking members. This more effectively prevents interference between light rays emitted from the side faces of the translucent members. Alternatively, the interference of light with respect to adjacent, unlit light emitting elements can be more effectively prevented.

There are no particular restrictions on the thickness of the translucent members, but an example is about 50 to 300 μm.

The upper faces of the translucent members can be formed in a uneven shape, as a curved face, as a lens shape, or any of various other shapes, and the lower faces are preferably parallel to the light extraction faces of the light emitting elements.

There are no particular restrictions on the material constituting the translucent members, but examples include a resin, a glass, an inorganic material, a cut plate from an ingot of monocrystals or polycrystals of fluorescent material or sinter of fluorescent material powder, or another such material, and a sinter of a mixture of a fluorescent powder with a resin, a glass, an inorganic material, etc. The higher is the transparency, the more readily will the light be reflected at the boundary with the light reflecting members, which increases the brightness.

Examples of the fluorescent material which allows to obtain white light in combination with a blue light emitting element include a YAG (Yttrium Aluminum Garnet)-based fluorescent material, a BOS (Barium ortho-Silicate)-based fluorescent material or the like. When such fluorescent material is contained in the translucent member, the fluorescent material is preferably contained in an amount of 5 to 50 wt %.

The translucent members are joined so as to cover the upper faces (light extraction faces) of the light emitting elements. This joining can be accomplished, for example, by compression bonding, sintering, bonding with a known adhesive agent such as epoxy or silicone, bonding with an organic adhesive agent with a high refractive index, or bonding with low-melting point glass.

For example, if the translucent members contain a fluorescent material, a light emitting device that emits light in a light bulb color conforming to JIS standards can be obtained by adding a red fluorescent material to an adhesive agent that joins these translucent members to blue light emitting elements.

Base Material 14

As shown in FIGS. 1A and 1B, the light emitting elements 11 are installed on the base material 14 in the light emitting device.

The base material can be any one that is known in this field and used for the mounting of light emitting elements and so forth. Examples of the base material include a substrate formed by an insulating member such as glass epoxy, resin, ceramic or the like, a metal member formed the insulating member and the like. Among them, those using a ceramic having high heat resistance and weather resistance are preferred. Examples of the ceramic material include alumina, aluminum nitride, mullite and the like, and the ceramic materials may combine with the insulating material such as BT resin, glass epoxy, epoxy resin or the like.

The base material usually has a wiring pattern (see 15 in FIG. 1A and elsewhere) on its surface that is connected to the light emitting elements.

The light emitting device is such that a plurality of light emitting elements are independently driven according to the wiring pattern of the base material and its power supply control, etc. This independent flash control can be any method that is known in this field and ordinarily used.

Embedding Material 19

Figure 7:
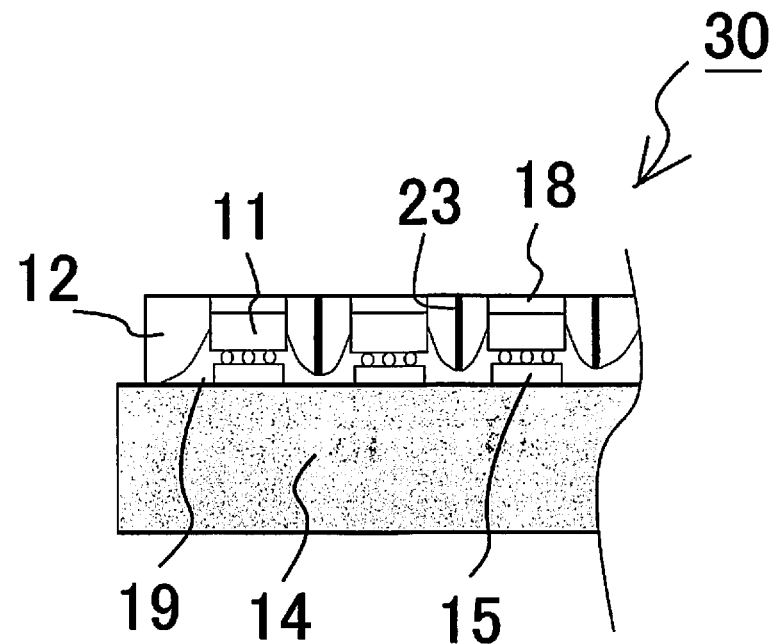
FIG. 7 is a simplified cross section of the light emitting device in Embodiment 3 of the present invention.

As discussed above, an embedding material is preferably disposed between the base material and the light emitting elements when the light emitting elements are joined on the base material (see 19 in FIG. 7). Disposing an embedding material between the base material and the light emitting elements improves heat dissipation and absorbs stress produced by the difference in the coefficients of thermal expansion between the light emitting elements and the base material.

The embedding material may be disposed only directly under the light emitting elements, or may extend from directly under the light emitting elements to between the light emitting elements, or may be in contact with part of the side faces of the light emitting elements. The embedding material can have a film thickness of about several microns to several hundred microns at the thickest point.

The embedding material is also known as an underfill, which usually includes a resin. The resin that is contained is preferably a light reflecting resin. Using a light reflecting resin allows the light emitted downward from the light emitting elements to be reflected, which results in a better light flux.

It is preferable for the embedding material to be made of a material whose elasticity and linear expansion are both lower than those of the light reflecting members, because there will be less resin expansion and contraction stress at the junctions between the light emitting elements and the base material, and the electrical junction reliability will be enhanced. Also, it is preferable to use a material with high mechanical strength for the light reflecting members, and for the embedding material to be completely covered by the light reflecting members so that the embedding material is not exposed on the outside. This ensures good durability with respect to external stress at the light emitting elements and the embedding material portions. If the embedding material and the light reflecting members are made of different materials, the embedding material is preferably cured prior to filling of the light reflecting members. This prevents the resins from mixing together, so the performance of each resin is not compromised.

The embedding material can be formed from a silicone resin composition, a modified silicone resin composition, an epoxy resin composition, a modified epoxy resin composition, an acrylic resin composition, etc., or a resin containing a silicone resin, an epoxy resin, a urea resin, a fluororesin, or a hybrid resin containing one or more of those resins as a base polymer and a light reflecting material. Among them, a resin containing silicone resin, epoxy resin, etc., as a base polymer is preferable. Here, the base polymer means a resin having the most component weight among the embedding material.

Examples of the light reflecting material include titanium dioxide, silicon dioxide, zirconium dioxide, potassium titanate, alumina, aluminum nitride, boron nitride, mullite, or the like. This allows the light from the light emitting element to be reflected efficiently.

The material constituting the embedding material may be a single type, or two or more types may be combined. This allows adjustment of the coefficient of linear expansion of the resin and/or the reflectivity of light.

Method for Manufacturing Light Emitting Device

Figure 2A:
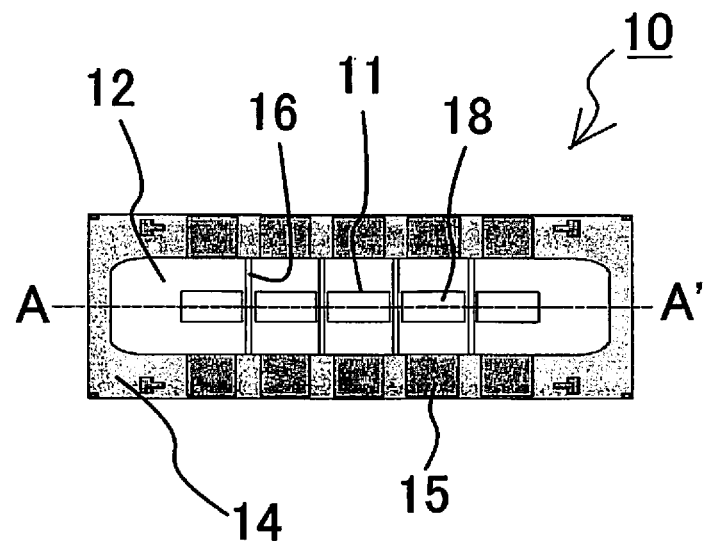
FIG. 2A is a simplified plan view of the process for manufacturing the light emitting device in Embodiment 1 of the present invention.
Figure 2B:
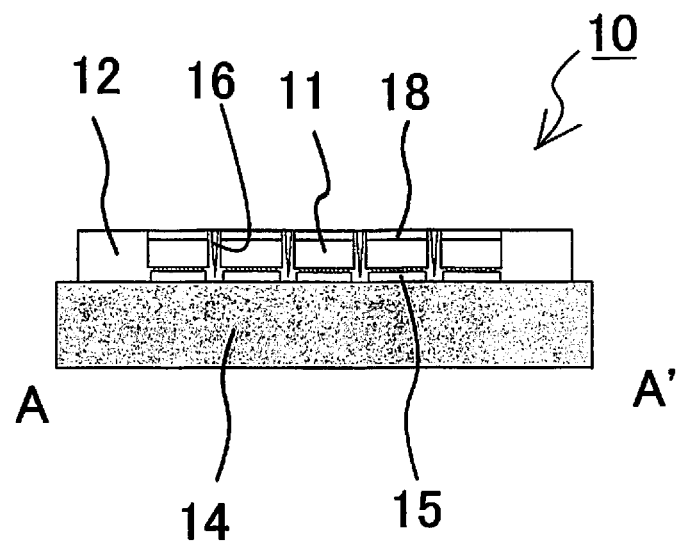
FIG. 2B is a cross section along the A-A' line in FIG. 2A.

As shown in FIGS. 2A and 2B, first the base material 14 having a wiring pattern 15 on its surface is provided.

A plurality of light emitting elements 11 are arranged and electrically connected on the wiring pattern 15 of the base material 14.

Next, translucent members 18 are joined on the upper faces of the light emitting elements 11, and the side faces of the translucent members 18 and the light emitting elements 11 are covered by the light reflecting members 12. The upper faces of the light reflecting members 12 lie on substantially the same plane as the light extraction faces (i.e., upper faces) of the translucent members 18.

After this, a blade or the like is used to cut the light reflecting members 12 between the light emitting elements 11 from one end to the other, forming grooves 16 between the light emitting elements 11. The cutting here may be done to a depth that matches the surface of the base material 14, but it does not necessarily have to reach the surface of the base material 14.

Figure 3:
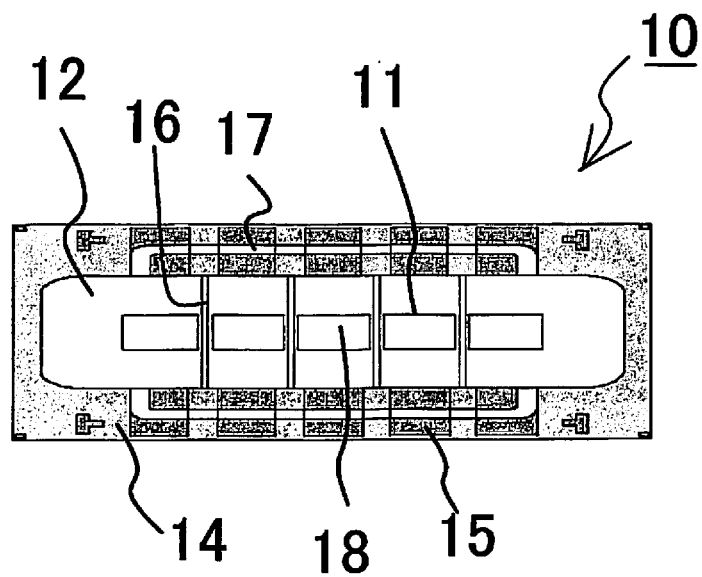
FIG. 3 is a simplified plan view of the process for manufacturing the light emitting device in Embodiment 1 of the present invention.

Next, as shown in FIG. 3, a frame 17 that integrally surrounds both ends of the grooves 16 is formed in the light reflecting members 12. The frame 17 here can be formed using the same resin as the light reflecting resin, for example.

Figure 4A:
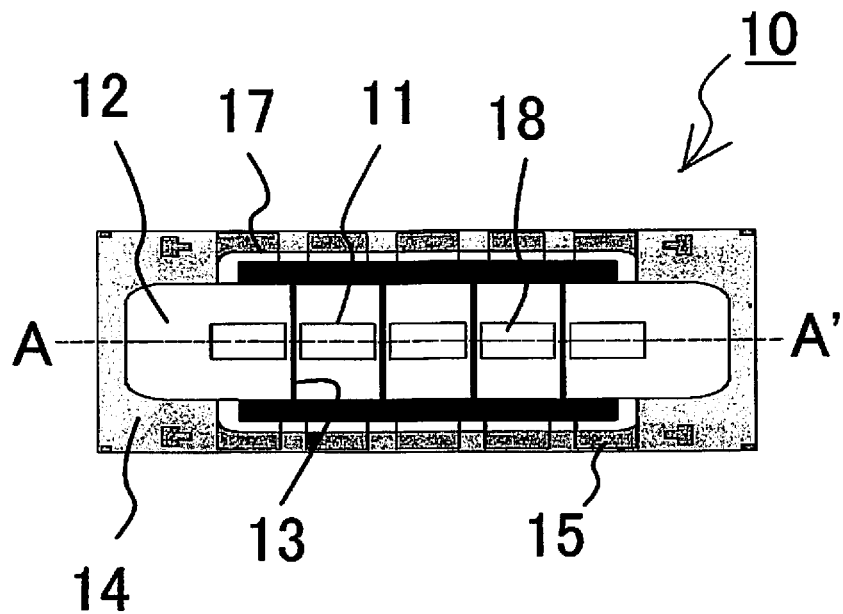
FIG. 4A is a simplified plan view of the process for manufacturing the light emitting device in Embodiment 1 of the present invention.
Figure 4B:
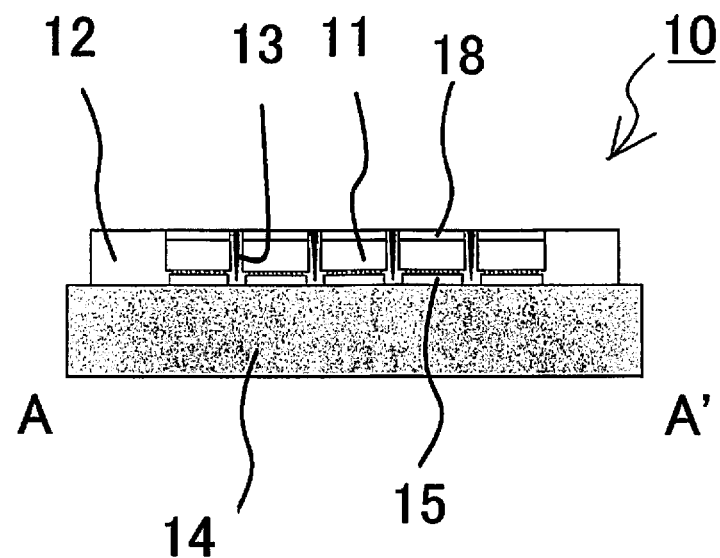
FIG. 4B is a cross section along the A-A' line in FIG. 4A.

After this, as shown in FIGS. 4A and 4B, the inside of the frame 17 is filled with a light blocking resin. The light blocking resin used here fills the inside of the grooves 16 formed in the light reflecting members 12 by capillary action. This allows the light blocking members 13 to be formed. The viscosity of the light blocking resin is preferably adjusted so that everything in the width direction and the depth direction inside the grooves 16 can be embedded.

Then, as shown in FIGS. 4A and 4B, the flame 17 and the light blocking resin outside the grooves 16 is removed as needed. The removal here can be accomplished by etching, for example. The upper faces of the light blocking members 13 lie substantially on the same plane as the light extraction faces of the translucent members 18 and the upper faces of the light reflecting members 12.

Embodiment 1

As shown in FIGS. 1A and 1B, the light emitting device in Embodiment 1 has five light emitting elements 11 that are arranged and connected in the column direction on the base material 14 having the wiring pattern 15 on its surface, the light reflecting members 12, and the light blocking members 13 disposed between the light reflecting members 12.

The base material 14 has a wiring pattern including titanium, platinum, or gold vapor deposited on the surface of an aluminum nitride plate having a thermal conductivity of about 170 W/m·K.

The light emitting elements 11 measure 1.0×1.0 mm and 0.11 mm thick, and include a semiconductor layer laminated on a sapphire substrate, with a pair of electrodes formed on the same side.

These light emitting elements 11 are flip-chip mounted on the base material 14 with bumps composed of gold. Therefore, the sapphire substrate is the light extraction face.

The upper faces of the light emitting elements 11 are covered by the translucent members 18 in the form of plate, which are formed by mixing and sintering YAG and alumina, with an adhesive agent composed of a silicone resin by using thermal curing.

The distance between the light emitting elements 11 is about 0.3 mm, and the distance between the translucent members 18 is about 0.2 mm.

The light reflecting members 12 cover the side faces of the light emitting elements 11 and the translucent members 18 covering the upper faces of the light emitting elements 11, and the outer peripheries of these.

The light reflecting members 12 contain 30 wt % titanium oxide in a silicone resin, and have a thermal conductivity of about 0.2 W/m·K.

The width of the light reflecting members 12 between the light emitting elements to the light blocking members 13 is about 70 μm in plan view.

The upper faces of the light reflecting members 12 lie on the same plane as the upper faces of the translucent members 18 on the upper faces of the light emitting elements 11, and the thickness at the thickest portion of the light reflecting members 12 is about 0.3 mm.

The light blocking members 13 disposed between the light reflecting members 12 are formed from a mixture of 5 wt % carbon black and 30 wt % titanium oxide in a silicone resin.

The light blocking members 13 are formed from one side to the other along opposing sides of the light reflecting members 12, and their width is about 60 μm in plan view. The lower faces of the light blocking members 13 reach near the surface of the base material 14, and the depth is about 0.28 mm.

The upper faces of the light blocking members 13 lie on the same plane as the upper faces of the light reflecting members 12 and the translucent members 18 on the upper faces of the light emitting elements 11.

Brightness Evaluation

This light emitting device 10 was used to measure the brightness distribution.

For the sake of comparison, a light emitting device was produced that was configured the same as the light emitting device 10, except that no light blocking members 13 were used.

Figure 5:
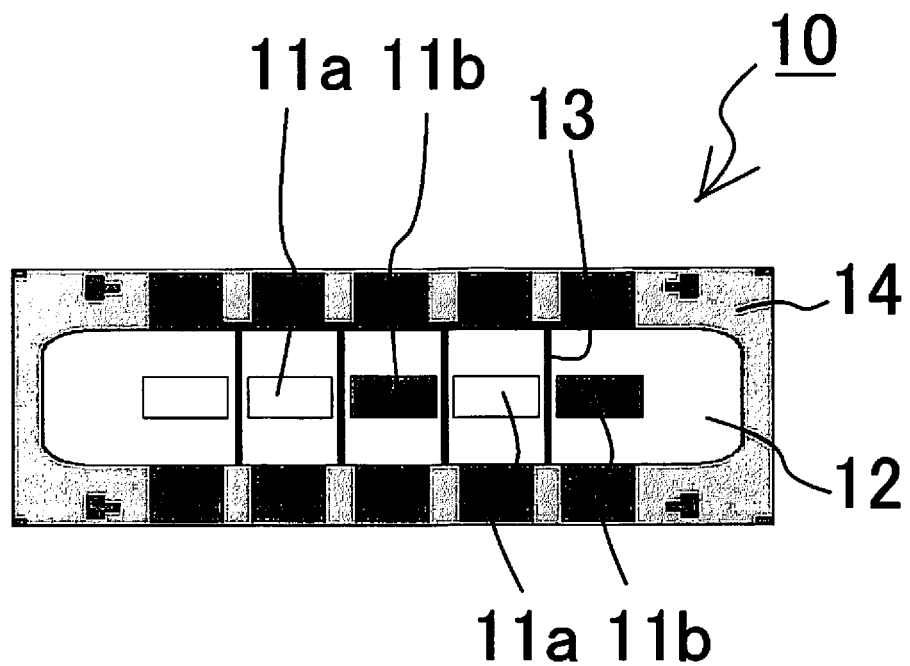
FIG. 5 is a simplified plan view illustrating a method for evaluating the light emitting device in Embodiment 1 of the present invention.

As shown in FIG. 5, the brightness distribution was measured using the light emitting device 10 and a comparative light emitting device each having two unlit light emitting elements 11b, one lit light emitting element 11a sandwiched between the two unlit light emitting elements 11b, and two adjacent light emitting elements, and a relative comparison was made using a ProMetric (PM-1423F-1).

With the comparative light emitting device, if we let 100 be the brightness of the two adjacent lit light emitting elements, the micro-emission level of the unlit light emitting element sandwiched between the two lit light emitting elements was 0.6.

Meanwhile, the micro-emission level of the unlit light emitting element with the light emitting device 10 in this embodiment was approximately 50% of that in the comparative light emitting device.

Thus, it was confirmed that with the light emitting device in this embodiment, there is a more steep difference in brightness between the emitting and non-emitting parts, and the resulting light emitting device had good visibility and a good brightness distribution.

Embodiment 2

Figure 6:
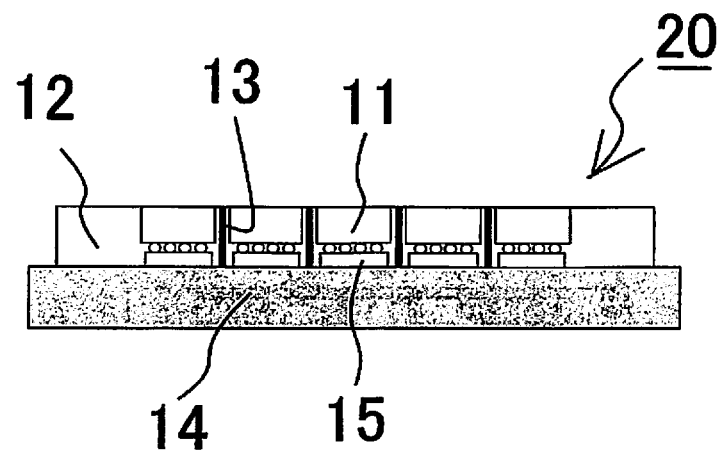
FIG. 6 is a simplified cross section of the light emitting device in Embodiment 2 of the present invention.

As shown in FIG. 6, the light emitting device 20 in this embodiment is configured substantially the same as the light emitting device 20 in Embodiment 1, except that the translucent members are not formed on the upper faces of the light emitting elements 11, the sapphire substrate surface of the light emitting elements is the light extraction face, and this light extraction face lies on the same plane as the upper faces of the light reflecting members 12 and the light blocking members 13.

This light emitting device 20 is similar to Embodiment 1 in that it is a light emitting device with good visibility and a good brightness distribution.

Embodiment 3

As shown in FIG. 7, the light emitting device 30 in this embodiment is configured substantially the same as the light emitting device 10 in Embodiment 1, except that an embedding material 19 is formed between the light emitting elements 11 and the base material 14, and the lower ends of grooves 23 are disposed so as to substantially coincide with the surface of the embedding material 19.

The embedding material 19 is formed by adding 30 wt % titanium oxide to a silicone resin. The embedding material 19 is formed by potting after the flip-chip mounting of the light emitting elements 11 with bumps, and the formation of the translucent members on the light extraction faces of the light emitting elements 11.

This light emitting device 30 is similar to Embodiment 1 in that it is a light emitting device with good visibility and a good brightness distribution.

Embodiment 4

Figure 8:
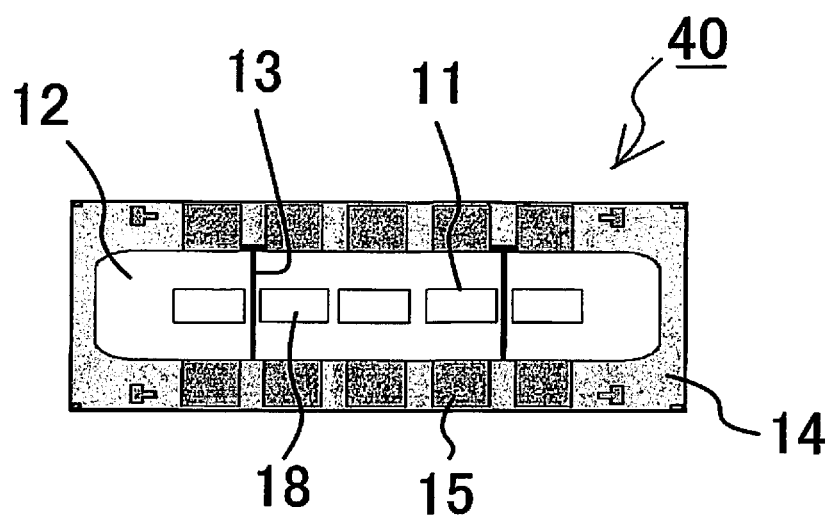
FIG. 8 is a simplified plan view of the light emitting device in Embodiment 4 of the present invention.

As shown in FIG. 8, the light emitting device 40 in this embodiment is configured substantially the same as the light emitting device 10 in Embodiment 1, except that the light blocking members 13 are formed only partially between the light emitting elements 11.

Embodiment 5

Figure 9:
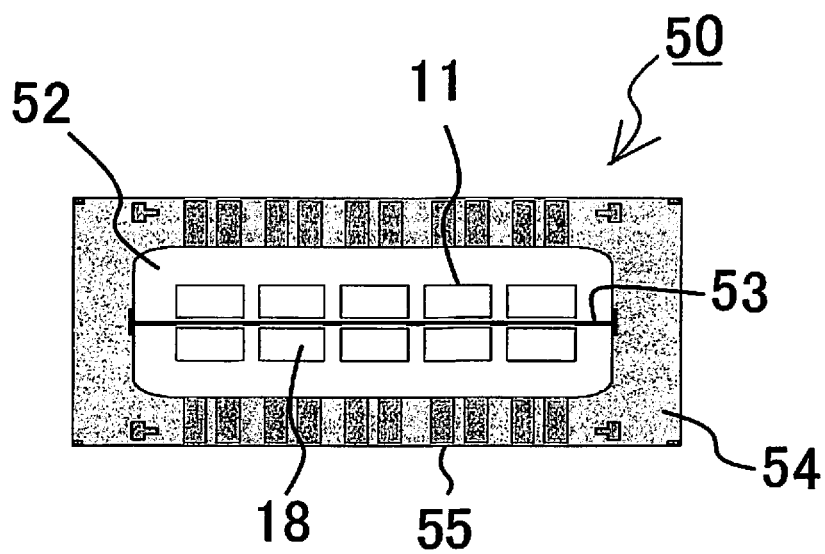
FIG. 9 is a simplified plan view of the light emitting device in Embodiment 5 of the present invention.

As shown in FIG. 9, the light emitting device 50 in this embodiment is configured substantially the same as the light emitting device 10 in Embodiment 1, except that the light emitting elements 11 are disposed in 5 columns and 2 rows, light blocking members 53 are formed between the light emitting elements 11 and between the rows, and the light blocking members 53 are not disposed between the light emitting elements 11 within the same row, and that light reflecting members 52 and the pattern shape of a wiring pattern 55 had by the base material 54 on its surface are changed along with this layout of the light emitting elements 11.

Unlike in FIG. 4A, the light blocking members 53 with this shape are such that a frame is formed on the left and right (the row direction) of the light reflecting members 52 in the light emitting device 50, and this frame is used to fill grooves formed in the light reflecting members 52 with the light blocking members by capillary action.

The light emitting device according to the present invention can be used for various kinds of light sources, such as illumination light sources, light sources for various kinds of indicators, light sources for automobile use, light sources for displays, back light sources for liquid crystal displays, light sources for sensors, signals, automobile use, channel control characters for channel boards.

As illustrated above, embodiments are described to give a concrete form to technical ideas of a light emitting device according to the present invention, the present invention is not limited to the described embodiments of the present invention. Also, obviously, numerous modifications and variations of the present invention are possible in light of the above teachings, which are within the scope and spirit of the invention, and such other modifications and variations are intended to be covered by the following claims.

What is claimed is:

1. A method of manufacturing a light emitting device comprising:

mounting a plurality of light emitting elements on a base material;

joining a plurality of translucent members respectively on upper surfaces of the light emitting elements after the mounting of the plurality of light emitting elements on the base material;

covering side surfaces of the light emitting elements and side surfaces of the translucent members with a light reflecting member at once by arranging the light reflecting member to be in contact with at least a part of each of the side surfaces of the light emitting elements after the joining of the plurality of translucent members respectively on upper surfaces of the light emitting elements;

forming cuts in the light emitting device to provide grooves in the light reflecting member between adjacent ones of the light emitting elements, respectively after the covering of the side surfaces of the light emitting elements and the side surfaces of the translucent members with the light reflecting member; and filling the grooves with a light blocking member after the forming of the cuts.

2. The method of manufacturing a light emitting device according to claim 1, wherein the forming of the cuts includes cutting the light reflecting member between the adjacent ones of the light emitting elements from one end of the light reflecting member to the other end of the light reflecting member.

3. The method of manufacturing a light emitting device according to claim 2, further comprising forming a frame on the base material so that the frame integrally surrounds the one end of the light reflecting member and the other end of the light reflecting member.

4. The method of manufacturing a light emitting device according to claim 3, wherein the filling of the grooves with the light blocking member includes filling an inside of the frame with the light blocking member to place the light blocking member in the grooves.

5. The method of manufacturing a light emitting device according to claim 4, further comprising removing the frame.

6. The method of manufacturing a light emitting device according to claim 1, wherein the mounting of the light emitting elements on the base material includes spacing the light emitting elements so that a distance between adjacent ones of the light emitting elements is less than a length of one side of each of the light emitting elements.

7. The method of manufacturing a light emitting device according to claim 1, wherein
the filling of the groove with the light blocking member includes arranging the light blocking member to extend in a straight line in plan view.

8. The method of manufacturing a light emitting device according to claim 1, wherein
the light blocking member is arranged between every pair of adjacent ones of the light emitting elements mounted on the base material.

9. The light emitting device according to claim 1, wherein the translucent member contains a fluorescent material.

10. A method of manufacturing a light emitting device comprising:
mounting a plurality of light emitting elements on a base material;
joining a single translucent member on upper surfaces of the light emitting elements after the mounting of the plurality of light emitting elements on the base material;
cutting the translucent member between adjacent ones of the light emitting elements after the joining of the single translucent member on the upper surfaces of the light emitting elements;
covering side surfaces of the light emitting elements and side surfaces of divided portions of the translucent member with a light reflecting member by arranging the light reflecting member to be in contact with at least a part of each of the side surfaces of the light emitting elements after the cutting of the translucent member;
forming cuts in the light emitting device to form grooves in the light reflecting member between adjacent ones of the light emitting elements after the covering of the side surfaces of the light emitting elements and the side surfaces of the divided portions of the translucent member with the light reflecting member; and
filling the grooves with a light blocking member after the forming of the cuts.

11. A method of manufacturing a light emitting device comprising:
mounting a plurality of light emitting elements on a base material;
covering side surfaces of the light emitting elements with a light reflecting member by arranging the light reflecting member to be in contact with at least a part of each of the side surfaces of the light emitting elements after the mounting of the plurality of light emitting elements on the base material;
forming cuts in the light emitting device to form grooves in the light reflecting member between adjacent ones of the light emitting elements after the covering of the side surfaces of the light emitting elements with the light reflecting member;
filling the grooves with a light blocking member after the forming of the cuts.

12. The method of manufacturing a light emitting device according to claim 11, further comprising
arranging a single translucent member on upper surfaces of the light emitting elements.

13. The method of manufacturing a light emitting device according to claim 1, wherein
the forming of the cuts includes cutting the light reflecting member so that the grooves do not reach the base material.

14. The method of manufacturing a light emitting device according to claim 10, wherein
the forming of the cuts includes cutting the light reflecting member so that the grooves do not reach the base material.

15. The method of manufacturing a light emitting device according to claim 11, wherein
the forming of the cuts includes cutting the light reflecting member so that the grooves do not reach the base material.

16. The method of manufacturing a light emitting device according to claim 1, wherein
the covering of the side surfaces of the light emitting elements and the side surfaces of the translucent members with the light reflecting member includes providing the light reflecting member that is configured to substantially reflect light emitted from the light emitting elements.

* * * * *